United States Patent [19]

Bean et al.

[11] Patent Number: 5,244,749
[45] Date of Patent: Sep. 14, 1993

[54] ARTICLE COMPRISING AN EPITAXIAL MULTILAYER MIRROR

[75] Inventors: John C. Bean, New Providence; David L. Windt, Springfield, both of N.J.

[73] Assignee: AT&T Bell Laboratories, Murray Hill, N.J.

[21] Appl. No.: 924,275

[22] Filed: Aug. 3, 1992

[51] Int. Cl.$^5$ .................. H01S 3/18; H01L 49/02
[52] U.S. Cl. .................. 428/620; 428/635; 428/641; 428/925; 257/19; 257/190; 372/45; 372/99
[58] Field of Search ............ 428/620, 635, 641, 925, 428/926; 257/18, 19, 190; 372/45, 92, 99; 359/838, 884

[56] References Cited

U.S. PATENT DOCUMENTS

| | | | |
|---|---|---|---|
| 4,205,329 | 5/1980 | Dingle et al. | 372/99 |
| 4,644,378 | 2/1987 | Williams | 372/45 |
| 4,819,243 | 4/1989 | Opschoor | 372/45 |
| 4,861,393 | 8/1989 | Bean et al. | 148/33.4 |
| 4,959,694 | 9/1990 | Gell | 257/19 |
| 4,991,179 | 2/1991 | Deppe et al. | 372/45 |
| 4,999,842 | 3/1991 | Huang et al. | 372/99 |
| 5,012,486 | 4/1991 | Luryi et al. | 372/45 |
| 5,063,569 | 11/1991 | Xie | 372/45 |
| 5,068,868 | 11/1991 | Deppe et al. | 372/45 |
| 5,088,099 | 2/1992 | Chen et al. | 372/45 |
| 5,091,756 | 2/1992 | Iga et al. | 372/45 |
| 5,136,345 | 8/1992 | Kasahara | 372/45 |

FOREIGN PATENT DOCUMENTS

| | | | |
|---|---|---|---|
| 260052 | 3/1988 | European Pat. Off. | 257/19 |
| 60-81887 | 5/1985 | Japan | 372/45 |
| 60-81888 | 5/1985 | Japan | 372/45 |
| 60-97684 | 5/1985 | Japan | 372/45 |
| 61-137388 | 6/1986 | Japan | 372/45 |
| 62-86883 | 4/1987 | Japan | 372/45 |
| 62-211784 | 9/1988 | Japan | 372/45 |
| 2-156589 | 6/1990 | Japan | 372/45 |
| 2-170486 | 7/1990 | Japan | 372/45 |
| 3-225885 | 10/1991 | Japan | 372/45 |
| 4-42589 | 2/1992 | Japan | 372/45 |

OTHER PUBLICATIONS

"Variation of Refractive Index in Strained $In_xGa_{1-x}$As—(GaAs Heterostructures)", by Utpal Das et al., J. Appl. Phys. 58 (1), Jul. 1, 1985, pp. 341–344.

"Principles of Optics", by M. Born and E. Wolf, 5th edition, Pergamon Press, 1975, pp. 51–70.

"Low-Voltage High-Gain Resonant-Cavity Avalanche Photodiode", by R. Kuchibhotla et al., IEEE Photonics Technology Letters, vol. 3, No. 4, Apr. 1991, pp. 354–356.

"High Quantum Efficiency, Long Wavelength InP/InGaAs Microcavity Photodiode", by A. G. Dentai et al., Electronics Letters, vol. 27, No. 23, Nov. 7, 1991, pp. 2125–2126.

Primary Examiner—John Zimmerman
Attorney, Agent, or Firm—Eugen E. Pacher

[57] ABSTRACT

We have found a way to, e.g., substantially increase the number of layers in a pseudomorphic strained layer semiconductor mirror over the number obtainable in an analogous conventional mirror, making it possible to obtain pseudomorphic strained layer mirrors of increased reflectance. Such a pseudomorphic mirror consists of alternating layers of a first and a second semiconductor material (e.g., $Ge_xSi_{1-x}/Si$), of thickness $t_1$ and $t_2$, and refractive index $n_1$ and $n_2$, respectively, with the number of layer pairs chosen such that the mirror thickness is less than or equal to the "critical thickness" $L_c$. For thicknesses $>L_c$ the mirror will contain dislocations.

An article according to the invention comprises a mirror whose layer thicknesses are chosen such that $n_1t_1 \neq n_2t_2$, with $n_1t_1 + n_2t_2 = p\lambda/2$, (p being an odd integer, typically 1). In other words, the optical thickness of the layers is not the conventional $p\lambda/4$. The thicknesses are also chosen such that the average lattice mismatch between substrate and mirror is reduced, compared to the analogous conventional ($\lambda/4$) mirror. Mirrors according to the invention can be advantageously used in optoelectronic devices such as surface emitting lasers and p-i-n photodetectors.

6 Claims, 2 Drawing Sheets

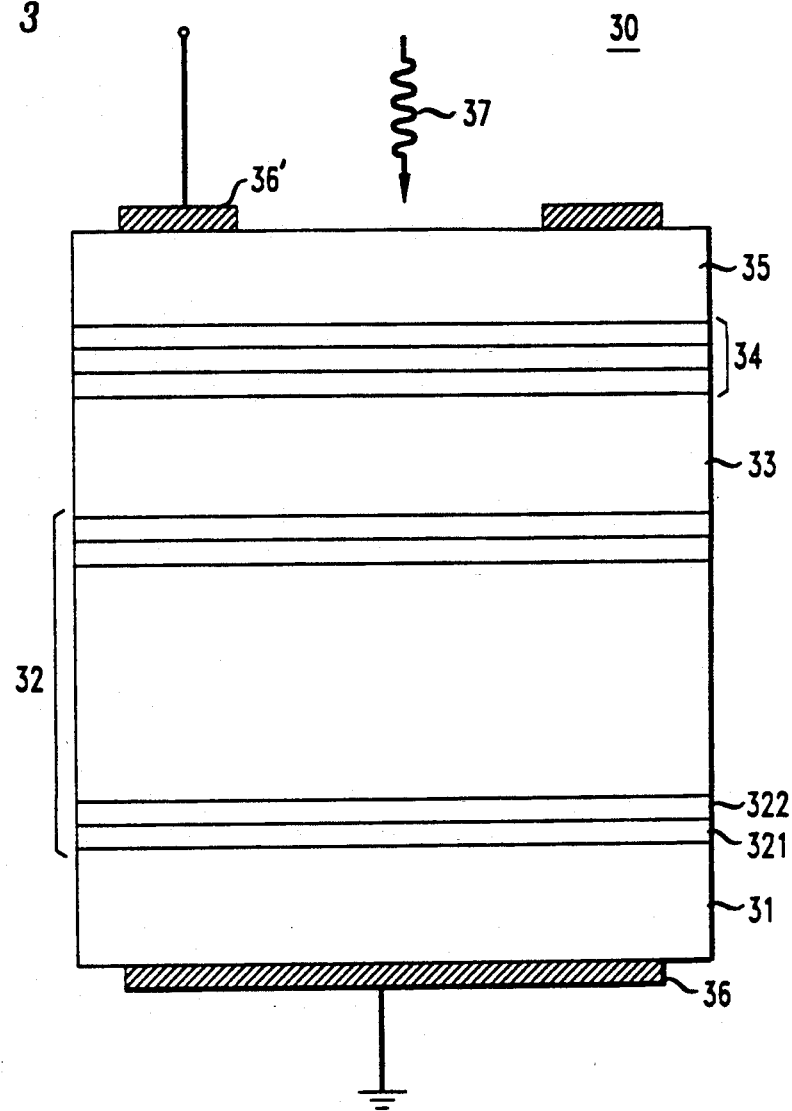

ARTICLE COMPRISING AN EPITAXIAL MULTILAYER MIRROR

FIELD OF THE INVENTION

This invention pertains to opto-electronic devices that comprise a strained layer epitaxial semiconductor multilayer mirror.

BACKGROUND OF THE INVENTION

Semiconductor multilayer mirrors are used in a variety of devices, e.g., in surface-transmitting lasers. Typically these mirrors consist of alternating layers of a first and a second semiconductor material, with each layer having optical thickness $\lambda/4$. The "optical thickness" is the actual thickness multiplied by the refractive index of the material at the wavelength $\lambda$. The theory of multilayer optical elements is well known. See, for instance, "Principles of Optics", M. Born and E. Wolf, 5th edition, Pergamon Pres 1975, pages 51-70, especially pages 66-70, which deal with periodically stratified media.

It is well known that essentially defect-free epitaxial growth of a (lattice mismatched) second semiconductor on a first semiconductor is in general only possible as long as the thickness of the second semiconductor layer does not exceed the so-called "critical thickness" $L_c$. Such strained material is referred to as "pseudomorphic". See, for instance, U.S. Pat. No. 4,861,393. The thickness $L_c$ depends, inter alia, on the lattice constant difference (the lattice "mismatch") between the first and the second semiconductor material, as exemplified by FIG. 1 for the case of $Si/Ge_xSi_{1-x}$. As shown by FIG. 1, if $x+0.1$ then $L_c$ is about 5 $\mu$m. The curve of FIG. 1 is based on measurements for $x \geq 0.16$ and is extrapolated for $x < 0.16$.

The existence of the relationship between lattice mismatch and $L_c$ implies that a stack of $Si/Ge_xSi_{1-x}$ layers, each of optical thickness $\lambda/4$, can be grown essentially defect (i.e., dislocation) free on Si only if the total thickness of the stack is less than $L_c$ appropriate for the average composition of the stack. For instance, for $\lambda = 1.3$ $\mu$m, the appropriate actual layer thickness of 92.8 nm for Si and 89.0 nm for $Ge_{0.25}Si_{0.75}$. The average composition of a $\lambda/4$ stack (for 1.3 $\mu$m radiation) of $Si/Ge_{0.25}Si_{0.75}$ thus is about $Ge_{0.122}Si_{0.878}$, i.e., $<x> = 0.122$, and $L_c$ for such a stack is about 2.25 $\mu$m. A pseudomorphic $\lambda/4$ stack of $Si/Gi_{0.25}Si_{0.75}$ on Si thus can contain at least 12 layer pairs. Thicker stacks will contain dislocations that provide stress relief.

Those skilled in the art will readily appreciate that the presence of dislocations in opto-electronic and other semiconductor device is highly undesirable. On the other hand, as exemplified above, pseudomorphic conventional multilayer mirrors typically would have relatively few layers and therefore have low reflectance, resulting typically in devices of relatively low efficiency.

In view of the importance of, e.g., efficient opto-electronic devices, would be desirable to have available a pseudomorphic multilayer second/first semiconductor layer stack on a first semiconductor substrate that contains more layer pairs than is provided by the prior art. This application discloses such a combination, and articles comprising the combination.

BRIEF DESCRIPTION OF THE DRAWINGS

FIG. 3 schematically depicts an exemplary article according to the invention, namely, a photodetector diode that comprises a non-symmetrical pseudomorphic strained layer stack.

THE INVENTION

Figure 1:
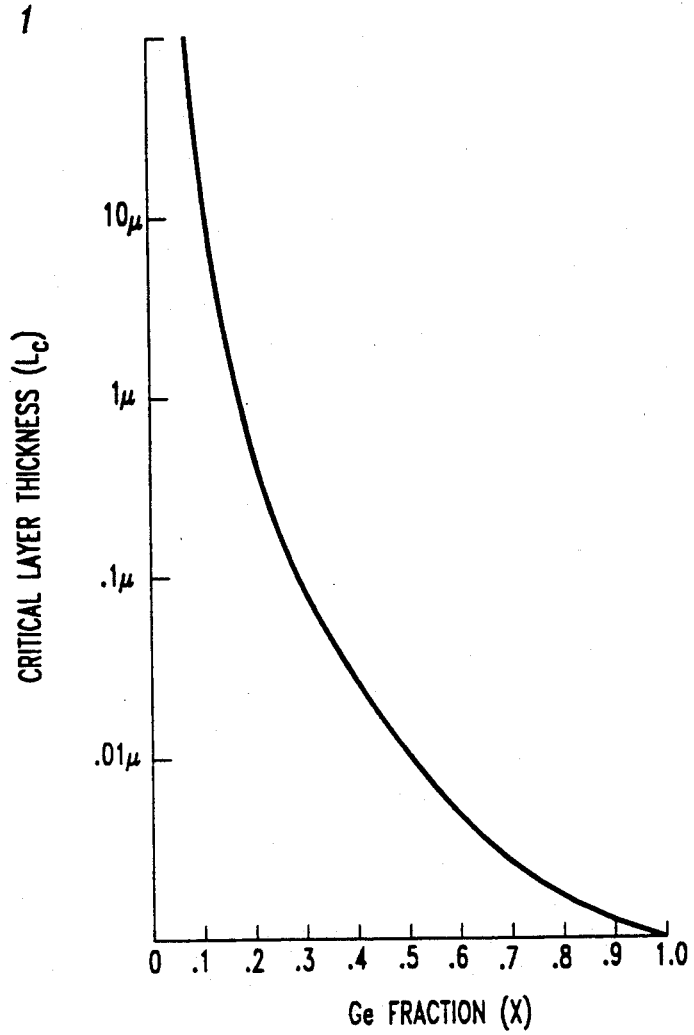
FIG. 1 shows $L_c$ as a function of composition parameter x, for $Ge_xSi_{1-1}$ on Si.

We have discovered that epitaxial strained layer semiconductor stacks can be designed such that substantially thicker pseudomorphic stacks are possible, as compared to prior art $\lambda/4$ pseudomorphic stacks. The discovery can translate, for instance, into substantially dislocation-free devices (which consequently can have lower leakage current than a prior art device that comprises a non-pseudomorphic mirror of the same number of layer pairs) or it can translate into devices that have pseudomorphic mirrors that comprise more pairs (and therefore can have higher reflectance) than mirrors in prior art devices. These and other advantages can be obtained if non-symmetrical mirrors are used, i.e., mirrors wherein the optical thickness of the layers of the one semiconductor is less than $\lambda/4$, and the optical thickness of the layers of the other semiconductor is greater than $\lambda/4$ (with the sum of the thicknesses being $\lambda/2$; it will be understood that a more general statement requires that the optical thicknesses be less than $p\lambda/4$, greater than $p\lambda/4$, and equal to $p\lambda/2$, respectively, where p is an odd integer. However, $p \neq 1$ is of little practical value).

More specifically, the invention is an article that comprises a semiconductor (e.g., Si, InP, GaAs, other III-V, or II-VI) substrate and a stack of semiconductor layers on the substrate and epitaxial therewith. The stack comprises a multiplicity of first semiconductor layers interleaved and epitaxial with a multiplicity of second semiconductor layers. A given first and second semiconductor layer are of thickness $t_1$ and $t_2$, respectively. The first and second semiconductor material have refractive indices $n_1$ and $n_2$ ($n_1 \neq n_2$), respectively, for radiation of a given wavelength $\lambda$. Associated with the stack of layers on the substrate is a critical thickness $L_c$. Significantly, $(t_1 n_1)$ is not equal to $(t_2 n_2)$, and $(t_1 n_1) + (t_2 n_2)$ is equal to $\lambda/2$ (or an odd multiple thereof). Furthermore, the thickness of the stack is less than or equal to the value of $L_c$ appropriate for the substrate/stack combination.

The substrate material can, but need not be, the same semiconductor as one of the layer semiconductors. The multilayer stack typically contains N nominally identical pairs of first/second semiconductor layers. It will be understood that conditions such as $(t_1 n_1) + (t_2 n_2) = \lambda/2$ are to be satisfied within experimentally attainable precision, typically to within $\pm 5$ or even $\pm 3\%$. The layer thickness are chosen such that the effective lattice constant difference between substrate and stack is reduced, compared to a prior art (symmetrical, $\lambda/4$) stack. For example, in the case of an unsymmetrical $Si/Ge_xSi_{1-x}$ stack on Si, the optical thickness of the $Ge_xSi_{1-x}$ layers is less than $\lambda/4$, and that of the Si layers is greater than $\lambda/4$. The principles of the invention apply directly also to other strained layer semiconductor systems, e.g., combinations of III-V or II-VI semiconductors such as $Ga_xIn_{1-x}As_xP_{1-x}$ on InP (for $x \neq 0.47$).

Although the invention is not so limited, the discussion below will primarily be in terms of $Si/Ge_xSi_{1-x}$ multilayer stacks on a Si substrate, with $0 < x \leq 1$.

Table 1 shows exemplary computed values of layer thickness ($t_{GeSi}$ and $t_{Si}$), average composition ($<x>$), metastable critical thickness ($L_c$ at $<x>$), stack thickness for a 20-pair stack (T at 20 periods), peak reflectivity of a free standing 20 pair stack, and peak reflectivity of the same 20 pair stack immersed in Si (R at 20 periods), for various "duty cycles", all for $\lambda = 1.3$ μm, and x (in $Ge_xSi_{1-x}/Si$) of 0.25. By "duty cycle" we mean the quantity $100 \times t_{GeSi}/(t_{Si} + t_{GeSi})$. As Table 1 shows, under the recited conditions a 20-pair stack of $Ge_x$-$Si_{1-x}/Si$ layers on Si can be pseudomorphic only if the duty cycle is about 40% or less.

the device. Desirably layers 33, 34 and 35 are of such thickness that their combined optical thickness is $p\lambda/2$ (with p being an odd integer), forming a resonant cavity. See, for instance, R. Kuchibhotla, *IEEE Photonics Technology Letters*, Vol. 3(4), p. 354, for an example of a GaAs-based photodiode with resonant cavity, and A. G. Dentai, *Electronics Letters*, Vol. 27 (23), p. 2125 (InP-based resonant cavity p-i-n diode).

It will be appreciated that the structure of FIG. 3 can be readily modified to receive light through the substrate. It will also be appreciated that the invention can be embodied in devices other than the above described photodiode. In fact, the invention can be advantageously used whenever an optical or opto-electronic semiconductor device comprises a multipair stack of strained layer semiconductor material. Exemplary of such devices are surface emitting lasers and lasers of the

TABLE 1

| Duty Cycle (%) | $t_{GeSi}$ (nm) | $t_{Si}$ (nm) | $<x>$ | $L_c$ at $<x>$ (μm) | T at 20 PERIODS (μm) | $R_{peak}$ at 20 PERIODS (%) FREE STANDING | $R_{peak}$ at 20 PERIODS (%) Si-IMMERSED |
|---|---|---|---|---|---|---|---|
| 10 | 17.8 | 167.1 | .0241 | >100 | 3.69 | 79.3 | 6.4 |
| 20 | 35.6 | 148.6 | .0483 | >100 | 3.68 | 83.6 | 20.8 |
| 30 | 53.4 | 130.0 | .0728 | 20 | 3.66 | 85.2 | 34.9 |
| 40 | 71.2 | 111.4 | .0975 | 6 | 3.65 | 84.0 | 44.0 |
| 50 | 89.0 | 92.9 | .1223 | 2¼ | 3.64 | 79.8 | 47.0 |
| 60 | 106.8 | 74.3 | .1474 | 1 | 3.62 | 83.9 | 44.0 |
| 70 | 124.7 | 55.7 | .1728 | ~½ | 3.61 | 85.2 | 34.9 |
| 80 | 142.4 | 37.1 | .1983 | ~0.2 | 3.59 | 84.0 | 21.0 |
| 90 | 160.2 | 18.5 | .2241 | ~0.13 | 3.57 | 80.3 | 6.7 |

Figure 2:
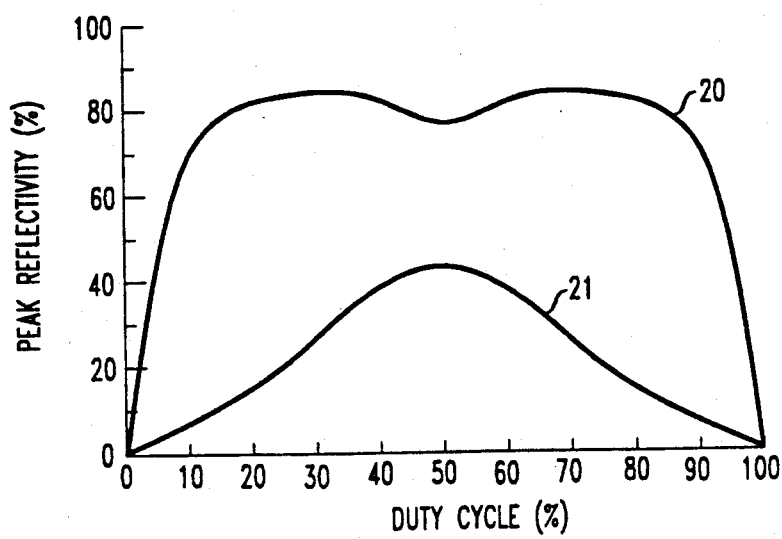
FIG. 2 shows a computed curve of peak reflectivities of a 20-pair stack of $Si/Ge_{0.25}Si_{0.75}$ as a function of duty cycle.

FIG. 2 shows the data of the last two columns of Table 1, with curve 20 being the reflectance of a free standing 20-pair $Ge_{0.25}Si_{0.75}/Si$ stack, and curve 21 of such a stack immersed in Si. As can be seen, due to the relatively high refractive index of Si, obtainable peak reflectances are much smaller than for an identical, but free standing, stack, As can also be seen, curve 21 decreases initially relatively slowly as the duty cycle departs from 50%, making it possible, for instance, to grow a pseudomorphic (commensurate) stack of N pairs of substantially the same peak reflectance as a prior art non-commensurate stack of N pairs.

FIG. 3 schematically depicts relevant aspects of a device according to the invention, namely, a Si-based p-i-n photodetector diode 30 that comprises a multilayer mirror 32 to enhance detection efficiency. The mirror is disposed on $n^+Si$ substrate 31, is epitaxial therewith, and comprises N identical unsymmetrical pairs of $n^+Ge_xSi_{1-x}/Si$ layers, (e.g., 321, 312). Each layer pair has a thickness t selected such that the optical thickness of the pair is $\lambda/2$. n and x are selected such that the stack thickness is less than or equal to $L_c$ (i.e., such that the stack is pseudomorphic), and such that the stack has the desired reflectivity. Exemplarily, $\lambda = 1.3$ μm, and the mirror contains 20 paris of $Ge_{0.3}Si_{0.7}/Si$ layers of thickness 53.4 nm and 130 nm, respectively. As Table 1 shows, $L_c$ in this case is about 20 μm, stack thickness is about 3.66 μm, and the peak reflectance of the stack is about 35%.

The device further comprises $n^+Si$ layer 33, absorbing strained layer superlattice 34, and $n^-Si$ layer 35. The superlattice exemplarily contains 20 periods of alternating $Ge_{0.6}Si_{0.4}$ (6 nm) and Si (29 nm). Conventional contacts 36 and 36' are also provided, with the latter being a ring contact, such that light 37 can enter type disclosed in U.S. Pat. No. 5,088,099, if their reflectors comprise strained layers.

We claim:

1. An article comprising a semiconductor substrate and a pseudomorphic stack of semiconductor layers on the substrate and epitaxial therewith, the stack comprising a multiplicity of first semiconductor layers interleaved and epitaxial with a multiplicity of second semiconductor layers, a given first and second semiconductor layer being of thickness $t_1$ and $t_2$, respectively, the first and second semiconductor material having refractive index $n_1$ and $n_2$, respectively, for radiation of a given wavelength $\lambda$, associated with the stack of layers on the substrate being a reflectivity at wavelength $\lambda$ and a metastable critical thickness $L_c$;

CHARACTERIZED IN THAT a) $(t_1 n_1) \neq (t_2 n_2)$, with $(t_1 n_1) + (t_2 n_2) = p\lambda/2$, where p is an odd integer; and b) the thickness of the stack is less than or equal to $L_c$.

2. An article according to claim 1, wherein p=1, and the substrate which has the same chemical composition as the second semiconductor which.

3. An article according to claim 2, wherein the substrate which is selected from the group consisting of Si, the III-V semiconductors, and the II-VI semiconductors.

4. An article according to claim 3, wherein the substrate is Si, and the first semiconductor material is $Ge_x$-$Si_{1-x}$, with ... $0 < X \leq 1$.

5. An article according to claim 3, wherein the article is a semiconductor photodetector.

6. An article according to claim 3, wherein the article is a semiconductor laser.

* * * * *

UNITED STATES PATENT AND TRADEMARK OFFICE
CERTIFICATE OF CORRECTION

PATENT NO. : 5,244,749
DATED : September 14, 1993
INVENTOR(S) : John C. Bean and David L. Windt It is certified that error appears in the above-indentified patent and that said Letters Patent is hereby corrected as shown below:

Column 4, line 52, "substract which" should read --substrate material--.

Column 4, line 53, "semiconductor which" should read --semiconductor material.--.

Signed and Sealed this

Tenth Day of May, 1994

Attest:

BRUCE LEHMAN

Attesting Officer     Commissioner of Patents and Trademarks